US012489073B1

(12) United States Patent
Machani et al.

(10) Patent No.: US 12,489,073 B1
(45) Date of Patent: Dec. 2, 2025

(54) ACENTRIC NON-ROUND ELECTRICAL INTERCONNECTIONS

(71) Applicant: GlobalFoundries U.S. Inc., Malta, NY (US)

(72) Inventors: Kashi Vishwanath Machani, Dresden (DE); Frank Küchenmeister, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/949,173

(22) Filed: Nov. 15, 2024

(51) Int. Cl.
*H01L 23/00* (2006.01)

(52) U.S. Cl.
CPC ............. *H01L 24/13* (2013.01); *H01L 24/04* (2013.01); *H01L 24/05* (2013.01); *H01L 24/06* (2013.01); *H01L 24/10* (2013.01); *H01L 24/11* (2013.01); *H01L 24/14* (2013.01); *H01L 24/03* (2013.01); *H01L 2224/0361* (2013.01); *H01L 2224/0401* (2013.01); *H01L 2224/05547* (2013.01); *H01L 2224/05551* (2013.01); *H01L 2224/05555* (2013.01); *H01L 2224/05557* (2013.01); *H01L 2224/05558* (2013.01); *H01L 2224/05691* (2013.01); *H01L 2224/0603* (2013.01); *H01L 2224/06051* (2013.01); *H01L 2224/06179* (2013.01); *H01L 2224/10126* (2013.01); *H01L 2224/1146* (2013.01); *H01L 2224/13007* (2013.01); *H01L 2224/13014* (2013.01); *H01L 2224/13017* (2013.01); *H01L 2224/13018* (2013.01); *H01L 2224/1403* (2013.01); *H01L 2224/14051* (2013.01); *H01L 2224/14179* (2013.01); *H01L 2924/35* (2013.01)

(58) Field of Classification Search
CPC ........ H01L 24/14; H01L 24/11; H01L 24/10; H01L 24/06; H01L 24/05; H01L 24/04; H01L 24/13
See application file for complete search history.

(56) References Cited

U.S. PATENT DOCUMENTS

| 5,773,888 A | 6/1998 | Hosomi et al. |
| 8,624,404 B1 | 1/2014 | Su et al. |
| 9,093,332 B2 | 7/2015 | Kuo et al. |
| 9,533,040 B2 | 1/2017 | Skalka et al. |
| 10,347,592 B2 | 7/2019 | Stone |
| 11,121,108 B2 | 9/2021 | Lin et al. |
| 2006/0076679 A1* | 4/2006 | Batchelor ............... H01L 24/13 257/737 |
| 2021/0057331 A1 | 2/2021 | Hou et al. |
| 2022/0223774 A1* | 7/2022 | Lim ....................... H05K 1/111 |

OTHER PUBLICATIONS

European Patent Office, Extended European Search Report and Opinion, issued in European Patent Application No. 25163143.8 on Sep. 16, 2025; 9 pages.

* cited by examiner

Primary Examiner — Suberr L Chi
(74) Attorney, Agent, or Firm — Thompson Hine LLP

(57) ABSTRACT

Structures for an electrical interconnection and methods of forming a structure for an electrical interconnection. The structure comprises a bond pad and an electrical interconnection including a pillar positioned on a portion of the bond pad. The pillar includes a first section and a second section between the first section and the portion of the bond pad. The second section has a cross section with a perimeter having a non-round closed shape, and the second section is positioned acentric relative to the first section.

20 Claims, 5 Drawing Sheets

ACENTRIC NON-ROUND ELECTRICAL INTERCONNECTIONS

BACKGROUND

The present disclosure relates generally to semiconductor devices and integrated circuit fabrication and, more specifically, to structures for an electrical interconnection and methods of forming a structure for an electrical interconnection.

A chip may be mounted on a laminate substrate to create a package assembly. Copper pillars may provide electrical interconnections between the laminate substrate and the back-end-of-line stack on the chip. However, copper pillars proximate to corners of the chip may receive high stresses that can cause failures in the interlayer dielectric layers of the back-end-of-line stack.

Improved structures for an electrical interconnection and methods of forming a structure for an electrical interconnection are needed.

SUMMARY

In an embodiment, a structure comprises a bond pad and an electrical interconnection including a pillar positioned on a portion of the bond pad. The pillar includes a first section and a second section between the first section and the portion of the bond pad. The second section has a cross section with a perimeter having a non-round closed shape, and the second section is positioned acentric relative to the first section.

In an embodiment, a method comprises forming an electrical interconnection including a pillar positioned on a portion of a bond pad. The pillar includes a first section and a second section between the first section and the portion of the bond pad, the second section has a cross section with a perimeter having a non-round closed shape, and the second section is acentric relative to the first section.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
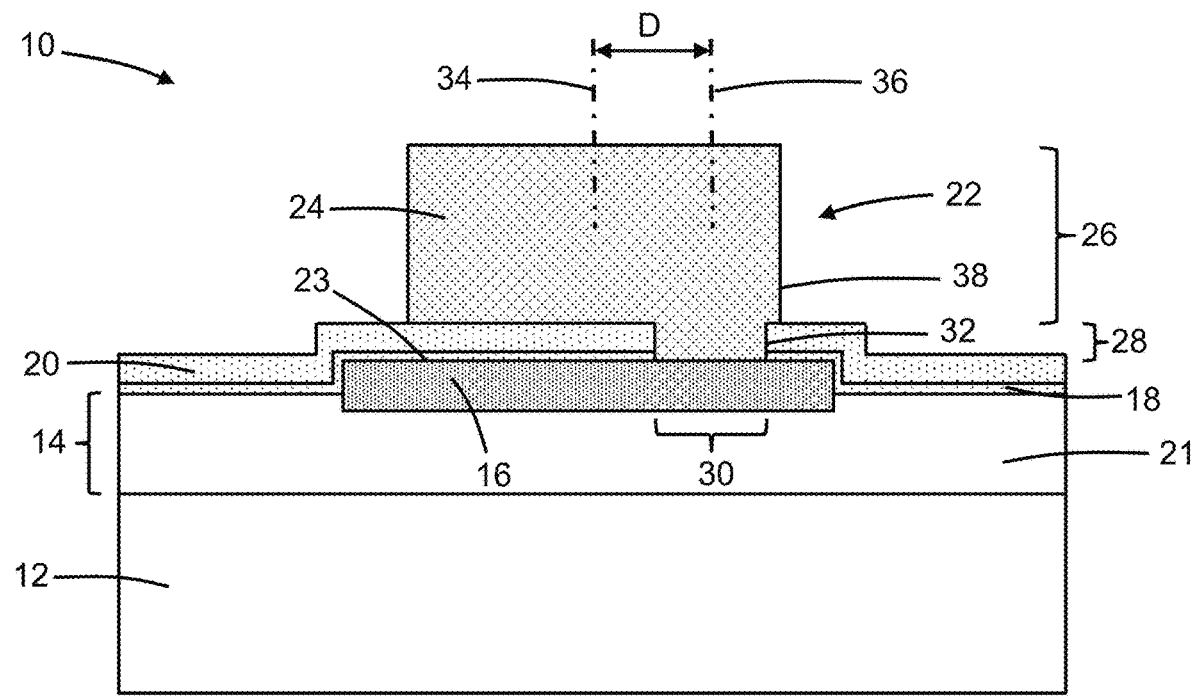
FIG. 1 is a cross-sectional view of a structure including an electrical interconnection in accordance with an embodiment of the invention.
Figure 2:
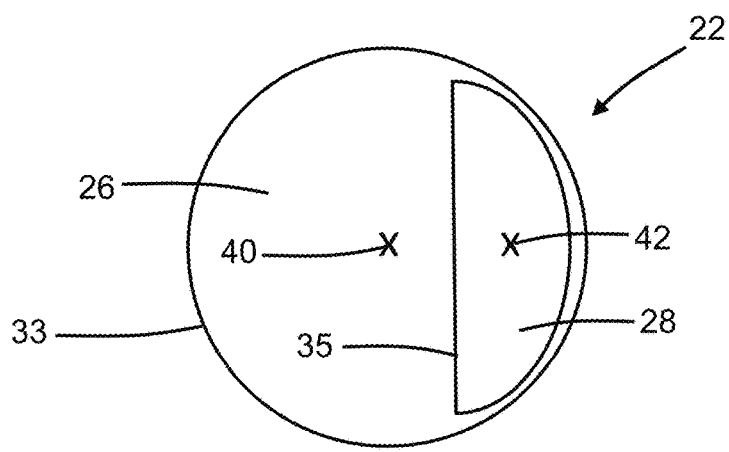
FIG. 2 is a bottom view including the pillar of the electrical interconnection of FIG. 1.

With reference to FIGS. 1, 2 and in accordance with embodiments of the invention, a structure 10 includes a substrate 12, a back-end-of-line stack 14 on the substrate 12, a bond pad 16 that may be included in the back-end-of-line stack 14, a dielectric layer 18, a passivation layer 20, and an electrical interconnection 22. In an embodiment, the substrate 12, the back-end-of-line stack 14, the bond pad 16, and the dielectric layer 18 and passivation layer 20 may be integrated into a chip or die, such as a photonics chip. In an embodiment, the substrate 12 may be comprised of a semiconductor material, such as single-crystal silicon. The dielectric layer 18 may be comprised of a dielectric material, such as an oxide of silicon (e.g., silicon dioxide), that is an electrical insulator. The passivation layer 20 may be comprised of an organic material, such as polyimide, polybenzoxazole, or a combination thereof, that is an electrical insulator and that may be photosensitive for patterning. The passivation layer 20 may provide a stress-relief and protective insulating layer.

The back-end-of-line stack 14 may include dielectric layers 21 belonging to multiple metallization levels that are arranged in a layer stack. The dielectric layers 21 of the back-end-of-line stack 14 may be comprised of dielectric materials, such as silicon dioxide, silicon nitride, tetraethylorthosilicate silicon dioxide, and/or fluorinated-tetraethylorthosilicate silicon dioxide, and metal features, such as interconnects and vias comprised of copper and aluminum, may be disposed within the dielectric layers 21 and coupled to circuit elements fabricated on the substrate 12. The bond pad 16 may be considered to be a metal feature in an uppermost metallization level of the back-end-of-line stack 14, and the back-end-of-line stack 14 may include metal features in the underlying metallization levels that are connected to the bond pad 16. In an embodiment, the bond pad 16 may have a top surface 23 that is planar or substantially planar.

The electrical interconnection 22 may include a pillar 24 that is positioned as a bump on the bond pad 16. The pillar 24 may be comprised of a metal, such as copper, and may be capped by one or more capping layers comprised of solder or a barrier layer comprised of nickel or another metal. The pillar 24 may be formed by a plating process. A layer of under-bump metallization (not shown) may be positioned between the pillar 24 and the bond pad 16.

The pillar 24 may have an upper section 26 and a lower section 28. The lower section 28 of the pillar 24 is positioned between the upper section 26 and the bond pad 16. In an embodiment, the lower section 28 of the pillar 24 may indirectly contact a portion of the bond pad 16 at the top surface 23. In an embodiment, the lower section 28 of the pillar 24 may directly contact a portion of the bond pad 16 at the top surface 23. The upper section 26 may be positioned fully above the passivation layer 20.

The upper section 26 of the pillar 24 may have the shape of a cylinder, such as a right circular cylinder, and may have a sidewall 38 that is cylindrical. In an embodiment, the upper section 26 may have a geometric center 40, an axis 34 extending through the geometric center 40, a cross section formed by a plane cutting through the upper section 26 at a right angle to the axis 34, and a perimeter 33 surrounding the cross section. In an embodiment, the cross section of the upper section 26 is a round closed shape and the perimeter 33 of the cross section is circular. The sidewall 38 is a projection of the perimeter 33 over the height of the upper section 26. In an embodiment, the cross section and the perimeter 33 of the upper section 26 may be uniform over the height of the upper section 26.

The lower section 28 of the pillar 24 may be characterized by a closed shape that differs from the closed shape of the upper section 26. The lower section 28 of the pillar 24 may have a non-cylindrical shape and may have a sidewall 32 that is non-cylindrical. The sidewall 32 may extend from the bond pad 16 to the upper section 26. In an embodiment, the lower section 28 may have a geometric center 42, an axis 36 extending through the geometric center 42, a cross section formed by a plane cutting through the lower section 28 at a right angle to the axis 36, and a perimeter 35 surrounding the cross section. The sidewall 32 is a projection of the perimeter 35 over the height of the lower section 28. The cross section of the lower section 28 is a non-round or unrounded closed shape and the perimeter 35 of the cross section is non-circular. In an embodiment, the perimeter 35 and the cross section of the lower section 28 may be uniform over the height of the lower section 28. The axis 36 of the lower section 28 may be aligned parallel to the axis 34 of the upper section 26.

In an embodiment, the perimeter 35 of the lower section 28 may include a curve and a line segment with endpoints that are joined to the curve at corners to define a half-moon closed shape. More specifically, the perimeter 35 of the lower section 28 may be a segment of a circle that is bounded by a chord represented by the line segment and an arc represented by the curve that is connected to the endpoints of the line segment.

The lower section 28 of the pillar 24 may be positioned inside an opening 30 that extends through the dielectric layer 18 and passivation layer 20 to the portion of the bond pad 16 contacted by the lower section 28. The opening 30 in the dielectric layer 18 and passivation layer 20 may surround the perimeter 35 of the lower section 28 and may have the non-round closed shape of the lower section 28. The opening 30 may be patterned in the dielectric layer 18 and passivation layer 20 by one or more lithography and etching processes. In an embodiment, the portion of the opening 30 in the dielectric layer 18 may be slightly larger than the portion of the opening 30 in the passivation layer 20.

The lower section 28 of the pillar 24 is laterally offset from the upper section 26 of the pillar 24 such that the lower section 28 is acentric (i.e., noncentric or not centered) relative to the upper section 26. More specifically, the axis 36 of the lower section 28 is laterally offset from the axis 34 of the upper section 26 by a distance D. In an embodiment, the upper section 26 may be centered on the bond pad 16 such that the axis 34 is aligned with the geometric center of the bond pad 16. In an embodiment, the line segment of the perimeter 35 of the lower section 28 may be positioned closer to the geometric center 40 of the upper section 26 than the curve of the perimeter 35. In an embodiment, lower section 28 may be laterally displaced such that the geometric center 40 of the upper section 26 has a non-overlapping relationship with the perimeter 35 of the lower section 28. When projected over a height of the lower section 28, the sidewall 32 includes a planar portion from the projection of the line segment of the perimeter 35 over the height of the lower section 28 and a curved portion from the projection of the curve of the perimeter 35 over the height of the lower section 28.

The organic material of the passivation layer 20 may also be positioned in the space between the upper section 26 of the pillar 24 and the bond pad 16 that is not occupied by the lower section 28 of the pillar 24. The pillar 24 has a tensile side, which is the side away from the lower section 28 of the pillar 24. The volume of the organic material of the passivation layer 20 beneath the pillar 24 is increased on the tensile side of the pillar 24, relative to conventional electrical connections, because of the non-round cross section and non-circular perimeter 35 of the lower section 28 and the acentric positioning of the lower section 28 of the pillar 24 relative to the upper section 26. The increased volume of organic material beneath the pillar 24 on the tensile side provides a mechanism to counteract the impact of chip-package interaction stress on failures of the back-end-of-line stack 14 and to thereby improve reliability.

Figure 3:
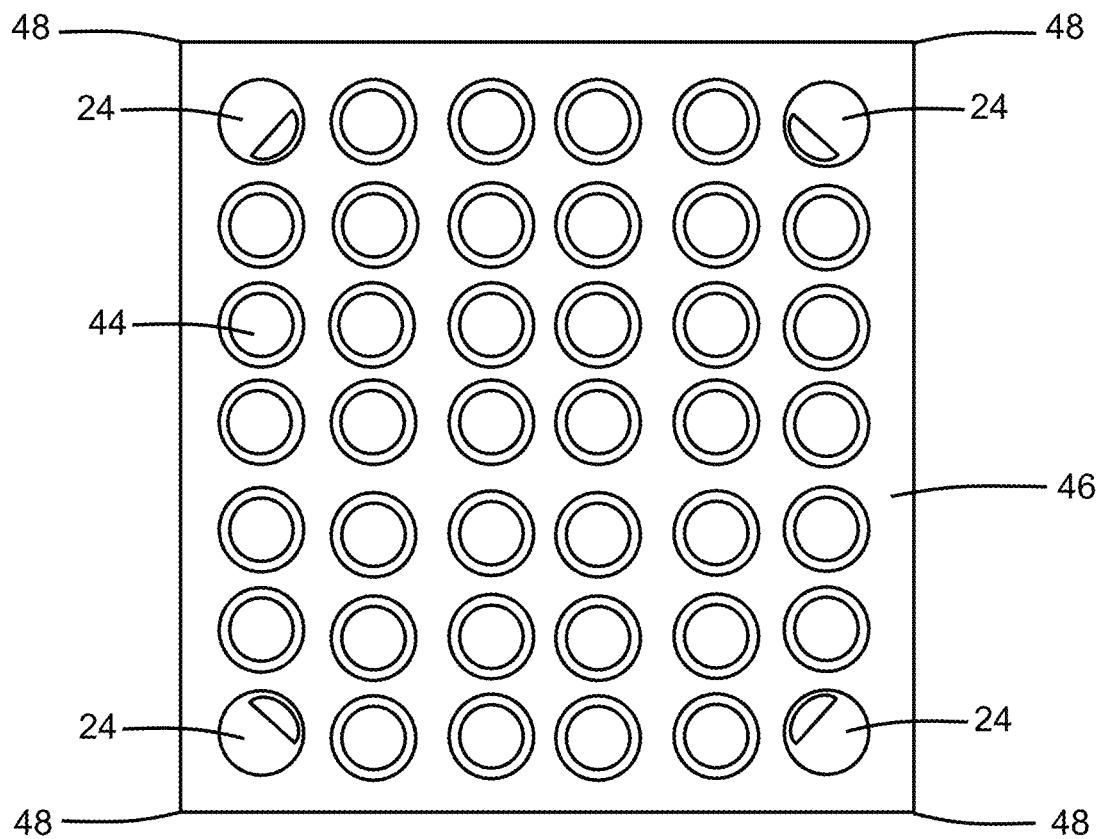
FIG. 3 is a top view of a chip including the electrical interconnection of FIGS. 1, 2.

With reference to FIG. 3 and in accordance with an embodiment, the electrical interconnection 22 may be deployed in instances as elements of an array that further includes electrical interconnections 44, which may each have a conventional construction with a round lower section that is centered relative to an upper section. The substrate 12 and the back-end-of-line stack 14 may belong to a die 46 having corners 48 that are adjacent to the array including the electrical interconnections 22 and the electrical interconnections 44. The substrate 12 and the back-end-of-line stack 14 may also have corners at, or adjacent to, the corners 48 of the die 46.

Each electrical interconnection 22 may be arranged within the array at the greatest distance from the center of the die 46. In that regard, each electrical interconnection 22 is rotationally oriented such that the geometric center 42 of the lower section 28 is placed at a maximum distance or substantially maximum distance from the adjacent corner 48 with the geometric center 40 of the upper section 26 between the geometric center 42 and the corner 48. Because the electrical interconnections 22 are placed in the array proximate to the corners 48, none of the electrical interconnections 44 in the array are positioned between the electrical interconnections 22 and the adjacent corners 48 of the die 46. Multiple electrical interconnections 44 are positioned in the array in proximity to the lower section 28 of the pillar 24, which is on a compressive side of the pillar 24 that is subjected to compressive stress. The tensile side of each pillar 24, which is subjected to tensile stress, is positioned adjacent to one of the corners 48.

The additional volume of organic material of the passivation layer 20, which is beneath the tensile side of each pillar 24 due to the non-round cross section and non-circular perimeter 35 of the lower section 28 and the acentric positioning of the lower section 28 relative to the upper section 26, operates to provide a stress absorber that reduces stress on the tensile side of the pillar 24. The absorption of stress reduces the transfer of chip-package interaction stress into the back-end-of-line stack 14 and alleviates reliability issues arising from chip-package interaction stress.

Figure 4:
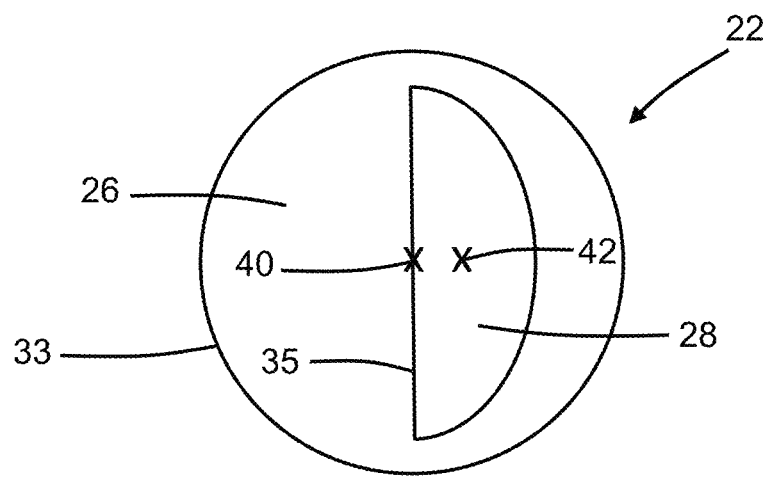
FIG. 4 is a bottom view of a pillar in accordance with an alternative embodiment of the invention.

With reference to FIG. 4 and in accordance with an embodiment, the lower section 28 of the pillar 24 may be laterally displaced on the bond pad 16 closer to the geometric center 40 of the upper section 26. In that regard, the offset D between the axes 34, 36 may be reduced by the lateral displacement but the acentric positioning of the lower section 28 is maintained. In an embodiment, the geometric center 40 of the upper section 26 may overlap with a portion of the sidewall 32 and perimeter 35.

Figure 5:
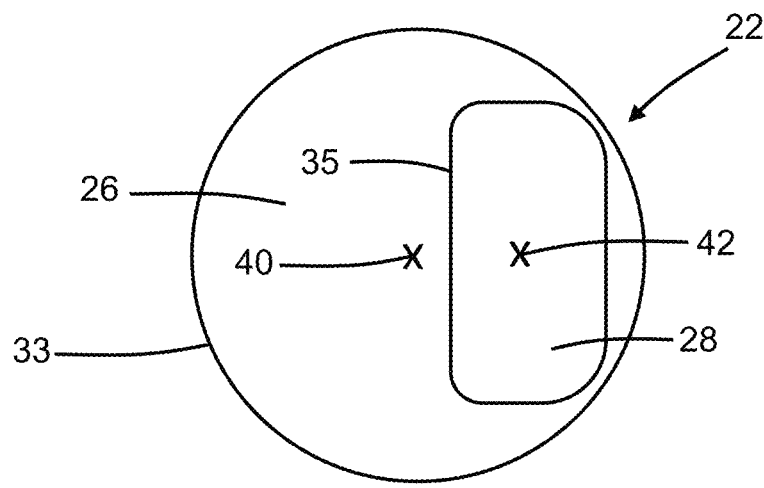
FIG. 5 is a bottom view of a pillar in accordance with an alternative embodiment of the invention.

With reference to FIG. 5 and in accordance with an embodiment, the perimeter 35 of the lower section 28 may include line segments with endpoints that are joined by curved corners to define a D-shape with a non-round cross-section and non-circular perimeter 35. The line segments may include a pair of line segments with different lengths and a shorter pair of line segments with equal lengths, and the curved corners may have different radii of curvature because of the line segments with different lengths. The longer line segment of the different-length pair may be positioned closer to the geometric center 40 than the shorter line segment of the different-length pair. The lower section 28 of the pillar 24 is laterally offset from the upper section 26 of the pillar 24 such that the lower section 28 is acentric relative to the upper section 26.

Figure 6:
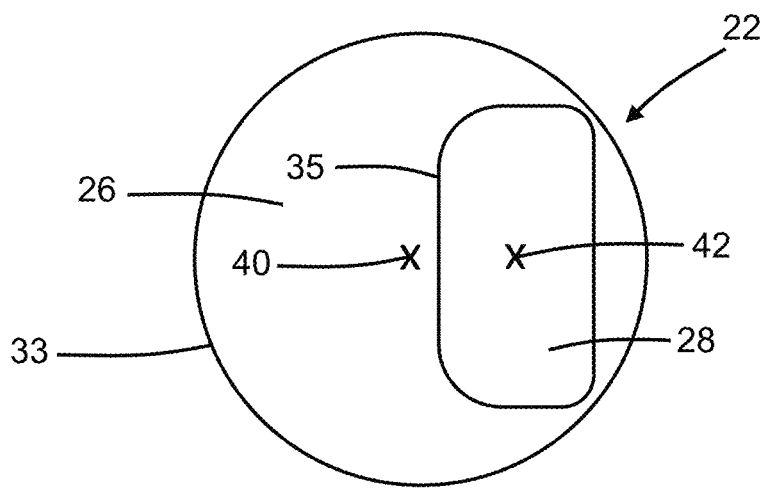
FIG. 6 is a bottom view of a pillar in accordance with an alternative embodiment of the invention.

With reference to FIG. 6 in which like reference numerals refer to like features in FIG. 5 and in accordance with an embodiment, the lower section 28 may be rotated by 180° about the geometric center 42 such that the shorter line segment of the different-length pair may be positioned closer to the geometric center 40 than the longer line segment of the different-length pair.

Figure 7:
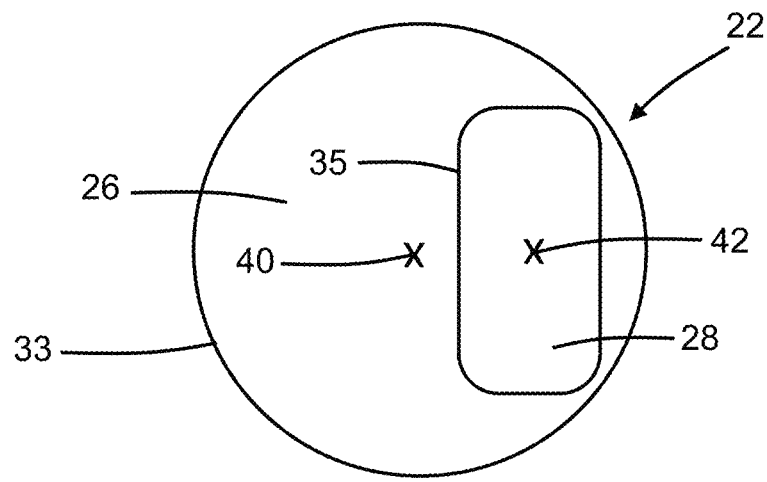
FIG. 7 is a bottom view of a pillar in accordance with an alternative embodiment of the invention.

With reference to FIG. 7 and in accordance with an embodiment, the perimeter 35 of the lower section 28 may include line segments with endpoints that are joined by curved corners to define an elongated O-shape with a non-round cross-section and non-circular perimeter 35. The line segments may include a longer pair of line segments with equal lengths and a shorter pair of line segments with equal lengths, and the curved corners may have the same radii of curvature. The lower section 28 of the pillar 24 is laterally offset from the upper section 26 of the pillar 24 such that the lower section 28 is acentric relative to the upper section 26.

Figure 8:
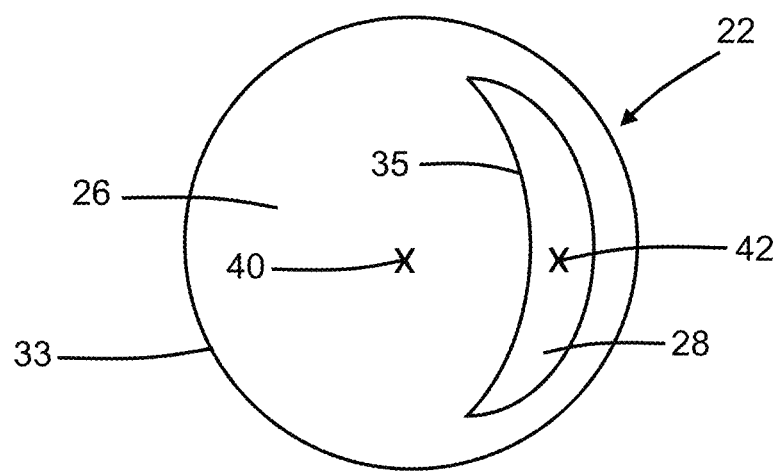
FIG. 8 is a bottom view of a pillar in accordance with an alternative embodiment of the invention.

With reference to FIG. 8 and in accordance with an embodiment, the perimeter 35 of the lower section 28 may include a pair of curves with endpoints that are joined by corners to define a crescent shape with a non-round cross-section and non-circular perimeter 35. The crescent shape includes a concavity that faces toward the geometric center 40 of the upper section 26. The lower section 28 of the pillar 24 is laterally offset from the upper section 26 of the pillar 24 such that the lower section 28 is acentric relative to the upper section 26.

Figure 9:
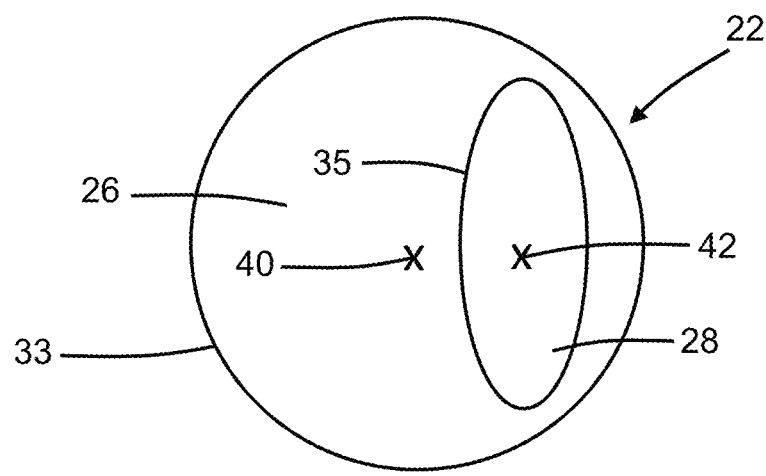
FIG. 9 is a bottom view of a pillar in accordance with an alternative embodiment of the invention.

With reference to FIG. 9 and in accordance with an embodiment, the perimeter 35 of the lower section 28 may have an oval or oblong shape with a non-round cross-section and non-circular perimeter 35. The lower section 28 of the pillar 24 is laterally offset from the upper section 26 of the pillar 24 such that the lower section 28 is acentric relative to the upper section 26.

Figure 10:
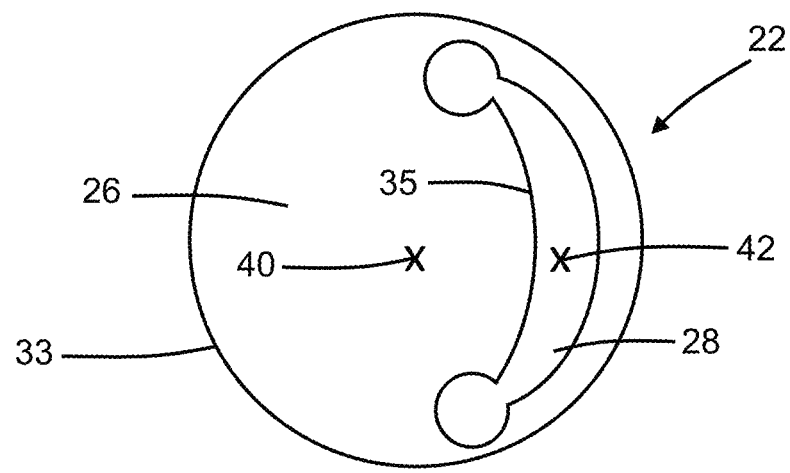
FIG. 10 is a bottom view of a pillar in accordance with an alternative embodiment of the invention.

With reference to FIG. 10 and in accordance with an embodiment, the perimeter 35 of the lower section 28 may have a composite shape that includes a combination of overlaid individual shapes. For example, the individual shapes forming the composite shape may include a crescent shape and round shapes overlaid at the opposite ends of the crescent shape. The lower section 28 of the pillar 24 is laterally offset from the upper section 26 of the pillar 24 such that the lower section 28 is acentric relative to the upper section 26.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction or plane in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "directly contacting" another feature if intervening features are absent. A feature may be "indirectly on" or in "indirect contact" with another feature if at least one intervening feature is present. Different features may "overlap" if a feature extends over, and covers a part of, another feature. A feature may "overlie" another feature if a feature is positioned "over" another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising: a bond pad; and an electrical interconnection including a pillar positioned on a portion of the bond pad, the pillar including a first section and a second section between the first section and the portion of the bond pad, the first section of the pillar having a first geometric center and a first axis extending through the first geometric center, the second section of the pillar having a second geometric center and a second axis, the second axis laterally offset from the first axis, the second section having a cross section in a plane cutting through the second section at a right angle to the second axis, and the cross section surrounded by a first non-circular perimeter.

2. The structure of claim 1 wherein the first section of the pillar is centered on the bond pad.

3. The structure of claim 1 wherein the first geometric center overlaps with a portion of the first non-circular perimeter of the second section of the pillar.

4. The structure of claim 1 wherein the first geometric center has a non-overlapping relationship with the second section of the pillar.

5. The structure of claim 1 further comprising:
a die having a corner,
wherein the first geometric center is positioned between the second geometric center and the corner of the die.

6. The structure of claim 5 wherein the first geometric center overlaps with a portion of the first non-circular perimeter of the second section of the pillar.

7. The structure of claim 5 wherein the first geometric center has a non-overlapping relationship with the second section of the pillar.

8. The structure of claim 1 further comprising:
a passivation layer having an opening, the passivation layer comprising an organic material that is an electrical insulator,
wherein the second section of the pillar is positioned inside the opening, and the organic material of the passivation layer is positioned between the first section of the pillar and the bond pad.

9. The structure of claim 8 wherein the organic material is polyimide.

10. The structure of claim 8 wherein the opening in the passivation layer surrounds the second section of the pillar.

11. The structure of claim 10 wherein the opening is surrounded by a second non-circular perimeter.

12. The structure of claim 1 wherein the first non-circular perimeter of the second section of the pillar includes a curve and a line segment with endpoints that are joined to the curve at corners.

13. The structure of claim 12 wherein the first geometric center overlaps with the line segment.

14. The structure of claim 12 wherein the line segment is closer to the first geometric center than the curve.

15. The structure of claim 12 wherein the first geometric center has a non-overlapping relationship with the second section of the pillar.

16. The structure of claim 1 wherein the first non-circular perimeter of the second section of the pillar includes a plurality of line segments with endpoints that are joined at corners.

17. The structure of claim 1 wherein the first non-circular perimeter of the second section of the pillar has a crescent shape with a concavity facing toward the first geometric center.

18. The structure of claim 1 wherein the first non-circular perimeter of the second section of the pillar has an oval shape.

19. The structure of claim 1 wherein the second section of the pillar includes a combination of a plurality of shapes.

20. A method comprising: forming an electrical interconnection including a pillar positioned on a portion of a bond pad, wherein the pillar includes a first section and a second section between the first section and the portion of the bond pad, the first section of the pillar having a first geometric center and a first axis extending through the first geometric center, the second section of the pillar having a second geometric center and a second axis, the second axis laterally offset from the first axis, the second section has a cross section in a plane cutting through the second section at a right angle to the second axis, and the cross section surrounded by a non-circular perimeter.

* * * * *